United States Patent [19]

Bond

[11] Patent Number: 5,033,091

[45] Date of Patent: Jul. 16, 1991

[54] CABLE INTERCONNECTION FOR AUDIO COMPONENT SYSTEM

[76] Inventor: Matthew R. Bond, 2680 Barrington Ave., Suite 205, W. Los Angeles, Calif. 90064

[21] Appl. No.: 420,334

[22] Filed: Oct. 12, 1989

[51] Int. Cl.[5] .................... H04B 15/00; H03F 21/00

[52] U.S. Cl. .................... 381/94; 381/77; 381/120; 174/32; 174/34; 174/105 R

[58] Field of Search .................... 174/32, 34, 105 R; 381/77, 94, 120

[56] References Cited

U.S. PATENT DOCUMENTS

| | | | |
|---|---|---|---|
| 4,317,002 | 2/1982 | Spicer | 174/105 R |
| 4,376,920 | 3/1983 | Smith | 174/105 R |
| 4,593,153 | 6/1986 | Kühn et al. | 174/34 |
| 4,599,483 | 7/1986 | Kühn et al. | 174/34 |
| 4,642,417 | 2/1987 | Ruthrof et al. | 174/105 R |
| 4,718,100 | 1/1988 | Brisson | 381/77 |
| 4,754,102 | 6/1988 | Dzurak | 174/32 |
| 4,939,315 | 7/1990 | Palmer | 174/32 |
| 4,945,189 | 7/1990 | Palmer | 174/34 |

OTHER PUBLICATIONS

Allied Radio Catalog, 280 (1969), pp. 325, 326, 342, 343, 380, 382.

*Primary Examiner*—Forester W. Isen
*Attorney, Agent, or Firm*—Poms, Smith, Lande & Rose

[57] ABSTRACT

A cable interconnection for an audio component system includes a first cable and a second cable. The first cable has a pair of first conductors, each of the first conductors are adapted to make an electrical connection between a source positive terminal and a load positive terminal of a signal source and load, respectively. The second cable has a trio of second conductors. A first one and a second one of the trio of second conductors, are each adapted to make an electrical connection between a source negative terminal and a load negative terminal of the source and load. A third one of the trio of second conductors is adapted to be coupled electrically only to the load negative terminal. The third one of the second conductors extends substantially the full length of the second cable. A rheostat may be provided to be coupled electrically in series between the third one of the second conductors and the load negative terminal. Adjustment of the rheostat provides for a variable length of the unterminated second conductor. Instead of a rheostat, a switch may be provided which selectively couples the unterminated conductor to or uncouples the unterminated conductor from the load negative terminal.

18 Claims, 1 Drawing Sheet

FIG. 1
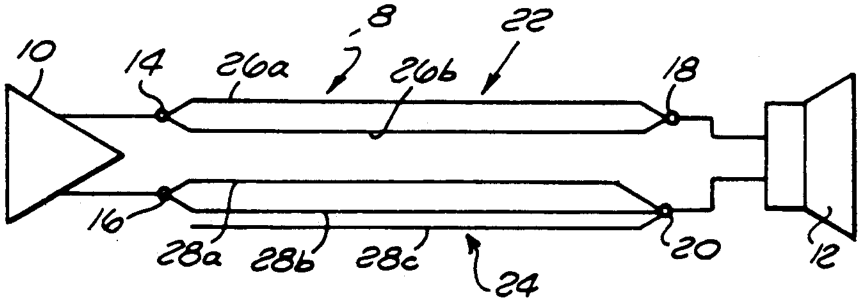
FIG. 2
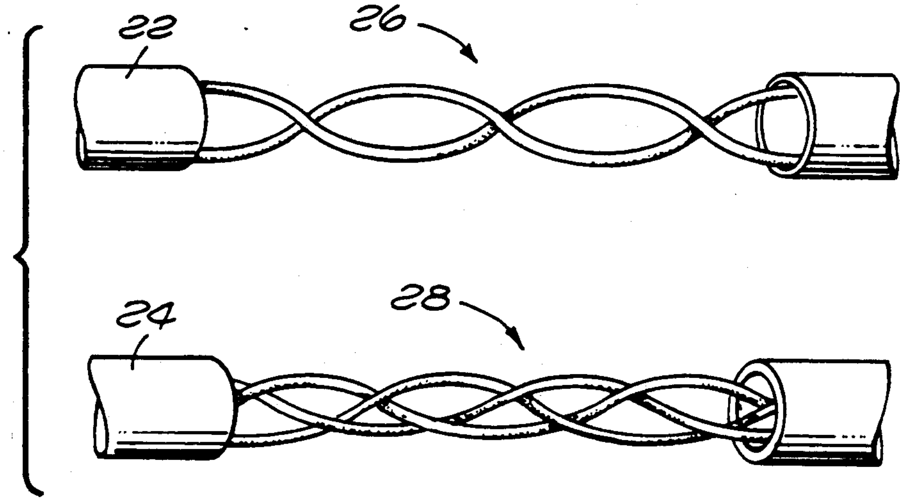
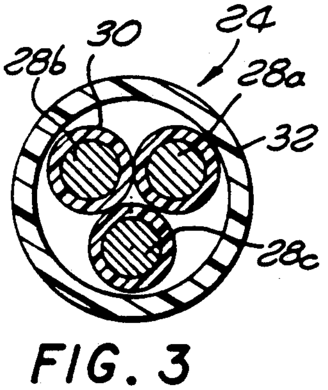
FIG. 3
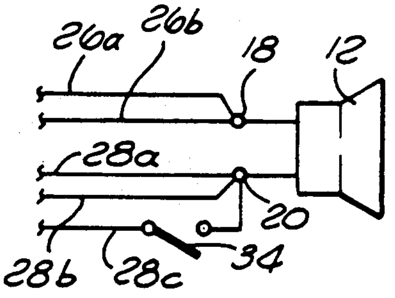
FIG. 4
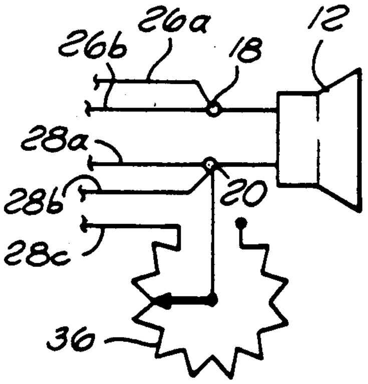
FIG. 5
FIG. 6
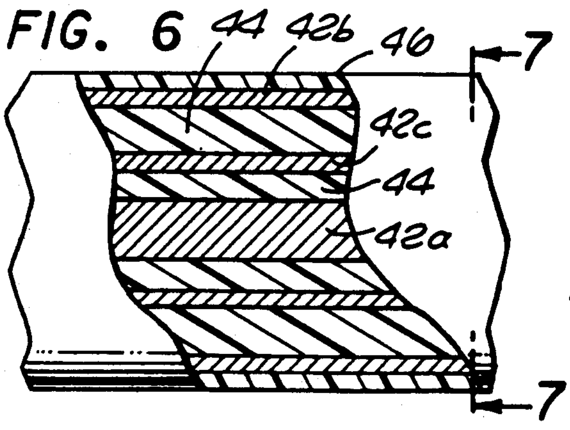
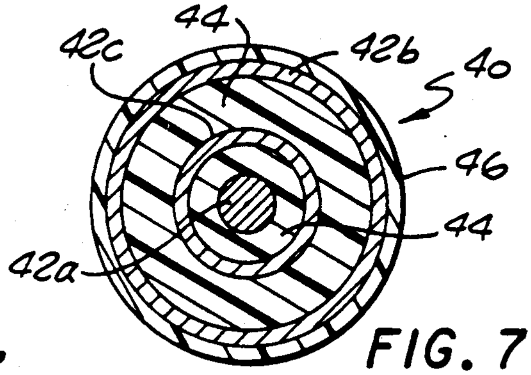
FIG. 7

CABLE INTERCONNECTION FOR AUDIO COMPONENT SYSTEM

FIELD OF THE INVENTION

The present invention relates generally to electrical cables and more particularly to a cable interconnection for an audio component system.

DESCRIPTION OF THE RELATED ART

In premium quality or high power audio systems, there is a need for cable to interconnect the components thereof which can handle high current densities while allowing the system to faithfully reproduce the full spectrum of sound. For example, in Brisson, U.S. Pat. No. 4,718,100, issued Jan. 5, 1988, a high current demand cable for an interconnecting system is disclosed. The cable, as described in the Brisson patent, conventionally connects a source positive to a load positive terminal and a source negative to a load negative terminal. Additionally, an open circuited conductor connected, for example, through the source positive terminal and wrapped around the conductor connecting the source negative and load negative terminals. Similarly, the second open circuited conductor is connected to the load negative terminal and is wrapped around the conductor interconnecting the source positive and load positive terminals.

SUMMARY OF THE INVENTION

According to the present invention, a novel cable interconnection for audio component system includes a first cable and a second cable. The first cable has a pair of first conductors, each of the first conductors are adapted to make an electrical connection between a source positive terminal and a load positive terminal of a signal source and load, respectively. The second cable has a trio of second conductors. A first one and a second one of the trio of second conductors, are each adapted to make an electrical connection between a source negative terminal and a load negative terminal of the source and load. A third one of the trio of second conductors is adapted to be coupled electrically only to the load negative terminal. In one embodiment of the present invention, the third one of the second conductors extends substantially the full length of the second cable.

In a further embodiment of the present invention, a rheostat may be provided to be coupled electrically in series between the third one of the second conductors and the load negative terminal. Adjustment of the rheostat provides for a variable length of the unterminated second conductor. Instead of a rheostat, another embodiment of the present invention contemplates a switch which selectively couples the unterminated conductor to or uncouples the unterminated conductor from the load negative terminal.

These and other objects, advantages, and features of the present invention will become readily apparent to those skilled in the art from a study of the following description of an exemplary preferred embodiment when read in conjunction with the attached drawings and appended claims.

BRIEF DESCRIPTION OF THE DRAWINGS

FIG. 1 a schematic diagram of a cable interconnection constructed in accordance with the principles of the present invention for an audio component system;

FIG. 2 is an enlarged, broken view of the cable interconnection of FIG. 1;

FIG. 3 is a cross-sectional view taken along line 3—3 of FIG. 2;

FIG. 4 is a partial schematic diagram view illustrating an alternative embodiment of the cable interconnection shown in FIG. 1;

FIG. 5 is a partial schematic diagram illustrating yet another alternative embodiment of the cable interconnection shown in FIG. 1;

FIG. 6 is an alternate embodiment of a portion of the cable interconnection in accordance with the present invention; and FIG. 7 cross-sectional view taken along line 7—7 of FIG. 6.

DESCRIPTION OF AN EXEMPLARY PREFERRED EMBODIMENT

Referring now to FIG. 1 and FIG. 2, there is shown a cable interconnection 8 for an audio component system. The audio component system includes a signal source, such an amplifier 10, and a load, such as a speaker 12. The amplifier 10 has a source positive terminal 14 and a source negative terminal 16. The speaker !2 has a load positive terminal 18 and a load negative terminal 20.

The cable interconnection 8 includes a first cable 22 and a second cable 24. The first cable 22 includes a pair of first conductors 26*a*, 26*b*. Each of the first conductors 26*a*, 26*b* are adapted to couple electrically the source positive terminal 14 to the load positive terminal 18, as best seen in FIG. 1.

The second cable 24 includes a trio of second conductors 28. A first one 28*a* and a second one 28*b* of the second conductors 28 are adapted to couple electrically the source negative terminal 16 to the load negative terminal 20. The third one 28*c* of the second conductors 28 is adapted to be coupled electrically only to the load negative terminal 20.

In a preferred embodiment of the present invention, each of the first conductors 26 and the second conductors 28 are insulated 18-gauge copper wire with an insulation 30 being disposed about the copper as best seen in FIG 3. Furthermore, a shrink-wrap cladding 32 holds each of the insulated copper wires within the first cable 22 and second cable 24.

Referring again to FIG. 2, the first conductors 26 form a twisted pair within the cable 22 and the second conductors 28 form a twisted triplet within the cable 24. In a preferred embodiment of the present invention, there is one full twist of each of the twisted pair and the twisted triplet for each three inches.

With further reference to FIG. 4, there is shown another embodiment of the cable interconnection 8 of the present invention which may include a switch 34. The switch 34 is adapted to be coupled serially between the third one 28*c* of the second 28 and the load negative terminal 20. The switch 34 allows for the selective coupling and uncoupling of the third one 28*c* of the second conductors 28 to and from the load negative terminal 20, respectively. The use of the switch 34 would be determined by room acoustics and other ambient conditions so that the best sound reproduction is obtained.

With further reference to FIG. 5, yet another embodiment of the cable interconnection 8 is shown. A rheostat 36 is adapted to be coupled serially between the third one 28*c* of the second conductors 28 and the load negative terminal 20. The rheostat 36 is selectively adjustable to vary the effective length of the third one 28c of the second conductors 28. Again, the adjustment is utilized so that the sound is faithfully reproduced by compensating for room acoustics and ambient conditions.

More particularly, the unterminated third one 28c of the second conductors 28 has been found to improve bass response and performance. This performance includes definition, extension, detail and clarity. The improvements obtained by the third one 28c of the second conductors 28 also extend through the mid-range frequencies and upper frequencies with better focus, imaging and transparency. The third one 28c of the second conductors 28 affects the back electromotive force of the voice coil actuator (not shown) in the speaker 12. Accordingly, the planar motion of the speaker 12 is minimized. As a result thereof, the amplifier 10 has greater power and headroom and the damping factor is improved. For example, when the loudspeaker cone and voice coil actuator return to the position of rest, the back electromotive force induces a current within the first cable 22 and second cable 24. The third one 28c of the second conductors 28 appears to reflect the induced current to dampen the motion of the voice coil actuator.

Some amplifier and speaker combinations do have some ability to control the back EMF satisfactorily. For example, some speaker designs do not require a high amount of amplifier damping. However, this is not true with most combinations of amplifiers and speaker. In those applications where the amplifier 10 and the speaker 12 combination are optimized, the embodiment of the invention described in reference to FIG. 1 or FIG. 4 may be used. However, the embodiment of FIG. 5 allows for a variable and controllable effect of the damping provided by the third conductor 28c of the second conductors 28. As the resistance of the rheostat 36 is increased, the damping provided by the third one 28c of the second conductors 28 is gradually lessened. Effectively, the rheostat 36 provides for a variable length of the third one 28c of the second conductors 28.

It has also been found that the control of the back EMF or current damping, in some instances, can also be accomplished by using unterminated conductor (not shown), similar to unterminated second conductor 28c, connected to the load positive terminal 18. The unterminated conductor connected to the load positive terminal 18 is then twisted with the fist conductors 26 to form a twisted triplet. The use of the unterminated conductor with the first conductors 26 may be either in replacement of or in combination with the third one 28c of the second conductors 28.

Referring now to FIG. 6 and 7, there is shown an alternative embodiment to a portion of the cable interconnection 8 utilizing a coaxial second cable 40. The cable 40 has a trio of coaxial second conductors 42. A center first one 42a of the second conductors 42 is adapted to couple electrically the source negative terminal 16 and the load negative terminal 20, similarly as hereinabove described with respect to the second cable 28. An outer second one 42b is adapted for grounding. A third one 42c of the second conductors 42 is disposed coaxially intermediate the first one 42a and the second one 42b of the second conductors 42. The third one 42c of the second conductors 42 is adapted to be coupled electrically only to the load negative terminal 20.

The second cable 40 further includes a dielectric material 44 coaxially disposed between each of the second conductors 42 and an insulative jacket 46 around the second one 42b of the second conductor 42. The third one 42c of the second conductors 42 extends substantially the full length of the second cable 40.

An alternative arrangement using coaxial cable 40 is where the center conductor 42a is used to electrically couple the source negative terminal 16 and the load negative terminal 20 and the outer second one 42b of the second conductors is coupled only at the load negative terminal. The third one 42c of the second conductors 42 is left unterminated at each end.

There has been hereinabove described a novel cable interconnection for an audio component system. Those skilled in the art may now make numerous uses of and departures from the present invention without departing from the inventive concepts disclosed herein. Accordingly, the present invention is to be defined solely by the scope of the following claims.

What is claimed is:

1. A cable interconnection for an audio component system, said audio component system including at least one signal source and at least one load, said source having a source positive terminal and a source negative terminal, said load having a load positive terminal and a load negative terminal, said cable interconnection comprising:

a first cable coupled to said source and said load, said first cable including a pair of first conductors, each of said first conductors coupled electrically to said source positive terminal and to said load positive terminal; and a second cable coupled to said source and said load, said second cable including a trio of second conductors, a first one and a second one of said second conductors coupled electrically to said source negative terminal and to said load negative terminal, a third one of said second conductors coupled electrically only to said load negative terminal.

2. A cable interconnection as set forth in claim 1 wherein each of said first conductors and said second conductors are insulated copper wires.

3. A cable interconnection as set forth in claim 2 wherein said copper wires are at least 18 gauge wire.

4. A cable interconnection as set forth in claim 2 wherein said first conductors are a twisted pair and said second conductors ar a twisted triplet.

5. A cable interconnection as set forth in claim 4 wherein each of said twisted pair and said twisted triplet each having one twist per three inches.

6. A cable interconnection as set forth in claim 1 wherein said third one of said second conductors extends substantially the full length of said second cable.

7. A cable interconnection as set forth in claim 1 further comprising a switch adapted to be coupled serially between said third one of said second conductors and said load negative terminal to couple and uncouple selectively said third one of said second conductors to and from said load negative terminal.

8. A cable interconnection for an audio component system, said audio component system including at least one signal source and at least one load, said source having a source positive terminal and a source negative terminal, said load having a load positive terminal and a load negative terminal, said cable interconnection comprising:

a first cable coupled to said source and to said load, said first cable including a pair of first conductors, each of said first conductors coupled electrically to said source positive terminal and to said load positive terminal;

a second cable coupled to said source and to said load, said second cable including a trio of second conductors, a first one and a second one of said second conductors coupled electrically to said source negative terminal and to said load negative terminal, a third one of said second conductors coupled electrically only to said load negative terminal; and a rheostat coupled serially between said third one of said second conductors and said load negative terminal.

9. A cable interconnection as set forth in claim 8 wherein each of said first conductors and said second conductors are insulated copper wires.

10. A cable interconnection as set forth in claim 9 wherein said copper wires are at least 18 gauge wires.

11. A cable interconnection as set forth in claim 9 wherein said first conductors are a twisted pair and said second conductors are a twisted triplet.

12. A cable interconnection as set forth in claim 11 wherein each of said twisted pair and said twisted triplet each have one twist per three inches.

13. A cable interconnection as set forth in claim 8 wherein said rheostat is selectively adjustable to vary an effective length of said third one of said second conductors.

14. A cable interconnection for an audio component system, said audio component system including at least one signal source and at least one load, said source having a source positive terminal and a source negative terminal, said load having a load positive terminal and a load negative terminal, said cable interconnection comprising:

a first cable coupled to said source and to said load, said first cable having at least one first conductor, said first conductor coupled electrically to said source positive terminal and to said load positive terminal; and a coaxial second cable coupled to said source and to said load, said second cable having a trio of coaxial second conductors, a center first one of said second conductors coupled electrically to said source negative terminal and to said load negative terminal, an outer second one of said second conductors coupled to ground, a third one of said second conductors disposed coaxially intermediate said first one and said second one of said second conductors and further coupled electrically to said load negative terminal.

15. A cable interconnection as set forth in claim 14 wherein said second cable further includes dielectric material coaxially disposed between each of said second conductors and an insulative jacket around said second one of said second conductors.

16. A cable interconnection as set forth in claim 14 wherein said third one of said second conductors extend substantially the full length of said second cable.

17. A cable interconnection as set forth in claim 14 further comprising a switch adapted to be coupled serially between said third one of said second conductors and said load negative terminal to couple and uncouple selectively said third one of said second conductors to and from said load negative terminal.

18. A cable interconnection as set forth in claim 14 further comprising:

a rheostat adapted to be coupled serially between said third one of said second conductors and said load negative terminal.

* * * * *